United States Patent
Kwon

(10) Patent No.: US 12,464,923 B2
(45) Date of Patent: Nov. 4, 2025

(54) METHOD OF MANUFACTURING DISPLAY APPARATUS

(71) Applicant: Samsung Display Co., Ltd., Yongin-si (KR)

(72) Inventor: Sunyoung Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 657 days.

(21) Appl. No.: 17/714,598

(22) Filed: Apr. 6, 2022

(65) Prior Publication Data

US 2022/0336535 A1 Oct. 20, 2022

(30) Foreign Application Priority Data

Apr. 19, 2021 (KR) .................. 10-2021-0050743

(51) Int. Cl.
| | |
|---|---|
| *H10K 59/38* | (2023.01) |
| *H10K 59/12* | (2023.01) |
| *H10K 59/131* | (2023.01) |
| *H10K 71/00* | (2023.01) |

(52) U.S. Cl.
CPC ............ *H10K 59/38* (2023.02); *H10K 59/12* (2023.02); *H10K 59/131* (2023.02); *H10K 59/1201* (2023.02); *H10K 71/00* (2023.02)

(58) Field of Classification Search
CPC ........ H10K 59/38; H10K 71/00; H10K 59/12; H10K 59/1201; H10K 50/125; H10K 59/122; H10K 2102/331
See application file for complete search history.

(56) References Cited

U.S. PATENT DOCUMENTS

| | | |
|---|---|---|
| 7,923,917 B2 | 4/2011 | Eida et al. |
| 10,185,066 B2 | 1/2019 | Chae et al. |
| 10,930,713 B2 | 2/2021 | Lee |
| 11,088,216 B2 | 8/2021 | Bae et al. |
| 11,839,128 B2 | 12/2023 | Choe |
| 12,063,837 B2 | 8/2024 | Ryu et al. |
| 12,193,302 B2 | 1/2025 | Song |

(Continued)

FOREIGN PATENT DOCUMENTS

| | | |
|---|---|---|
| CN | 111430444 A | 7/2020 |
| JP | 2019-529989 A | 10/2019 |

(Continued)

*Primary Examiner* — Eliseo Ramos Feliciano
*Assistant Examiner* — Timothy Edward Duren
(74) *Attorney, Agent, or Firm* — Womble Bond Dickinson (US) LLP

(57) ABSTRACT

A method of manufacturing a display apparatus having at least one first color emission layer and at least one second color emission layer includes: forming a first color filter layer in a first area of a substrate, a second color filter layer in a second area of the substrate, and a third color filter layer in a third area of the substrate; forming a bank having a first opening overlapping the first area, a second opening overlapping the second area, and a third opening overlapping the third area; and forming a first transmissive layer filling at least a portion of the first opening, a second transmissive layer filling at least a portion of the second opening and including a same material as the first transmissive layer, and a third color quantum dot layer filling at least a portion of the third opening.

20 Claims, 15 Drawing Sheets

(56) References Cited

U.S. PATENT DOCUMENTS

| | | | | |
|---|---|---|---|---|
| 2018/0107028 A1* | 4/2018 | Jung | ................. | G02F 1/133617 |
| 2018/0164640 A1* | 6/2018 | Kim | ................. | G02F 1/133606 |
| 2018/0284541 A1* | 10/2018 | Kang | ................. | G02F 1/133617 |
| 2020/0119101 A1 | 4/2020 | Lee | | |
| 2020/0343310 A1 | 10/2020 | Bae et al. | | |
| 2020/0348563 A1 | 11/2020 | Takeya et al. | | |
| 2020/0373360 A1 | 11/2020 | Hack et al. | | |
| 2020/0381484 A1 | 12/2020 | Choe | | |
| 2021/0050388 A1 | 2/2021 | Song | | |
| 2021/0343793 A1 | 11/2021 | Weng et al. | | |
| 2022/0199716 A1* | 6/2022 | Nakanishi | .............. | H05B 33/12 |
| 2022/0317511 A1* | 10/2022 | Shi | ................... | G02F 1/133548 |
| 2023/0037592 A1* | 2/2023 | Huang | ................. | H10K 50/865 |

FOREIGN PATENT DOCUMENTS

| | | | | |
|---|---|---|---|---|
| KR | 10-2018-0018945 A | | 2/2018 | |
| KR | 10-2020-0041044 A | | 4/2020 | |
| KR | 10-2020-0124372 A | | 11/2020 | |
| KR | 10-2020-0135727 A | | 12/2020 | |
| KR | 10-2020-0138528 A | | 12/2020 | |
| KR | 10-2021-0021216 A | | 2/2021 | |
| WO | WO-2020208671 A1 * | | 10/2020 | ......... H01L 27/3218 |

\* cited by examiner

METHOD OF MANUFACTURING DISPLAY APPARATUS

CROSS-REFERENCE TO RELATED APPLICATION

This application claims priority to and the benefit of Korean Patent Application No. 10-2021-0050743, filed on Apr. 19, 2021, in the Korean Intellectual Property Office, the entire content of which is hereby incorporated by reference.

BACKGROUND

1. Field

One or more embodiments relate to a method of manufacturing a display apparatus, and more particularly, to a method of manufacturing a display apparatus whereby defects in a manufacturing process may be reduced or minimized and process efficiency may be improved.

2. Description of the Related Art

Display apparatuses are configured to display data (e.g., an image) visually. Display apparatuses may be utilized as displays for small products such as mobile phones or large products such as televisions.

A display apparatus has a plurality of pixels. In order to implement full color display apparatuses, a plurality of pixels may emit lights of different colors from each other. To achieve this effect, at least some pixels of a display apparatus may have a color converter. Therefore, lights from emission areas of some pixels may be converted into lights of different colors from each other while passing through the color converters corresponding thereto, and may be extracted to (e.g., emitted toward) the outside.

SUMMARY

In a related art method of manufacturing a display apparatus, defects may occur in a manufacturing process or process efficiency may be low.

Aspects according to one or more embodiments are directed toward a method of manufacturing a display apparatus whereby defects in a manufacturing process may be reduced or minimized and process efficiency may be improved. However, this is merely an example, and the scope of the present disclosure is not limited thereby.

Additional aspects will be set forth in part in the description which follows and, in part, will be apparent from the description, or may be learned by practice of the presented embodiments of the disclosure.

According to one or more embodiments, a method of manufacturing a display apparatus having at least one first color emission layer and at least one second color emission layer includes forming a first color filter layer in a first area of a substrate, a second color filter layer in a second area of the substrate, and a third color filter layer in a third area of the substrate, forming a bank having a first opening overlapping the first area, a second opening overlapping the second area, and a third opening overlapping the third area, and forming a first transmissive layer filling at least a portion of the first opening, a second transmissive layer filling at least a portion of the second opening and including a same material as the first transmissive layer, and a third color quantum dot layer filling at least a portion of the third opening.

According to some embodiments, the first transmissive layer, the second transmissive layer, and the third color quantum dot layer may be formed through an inkjet process.

According to some embodiments, the inkjet process may include injecting a transmissive layer material into the first opening and the second opening and injecting a quantum dot layer material into the third opening, and curing the transmissive layer material and the quantum dot layer material.

According to some embodiments, the curing of the transmissive layer material and the quantum dot layer material may include removing a portion of the transmissive layer material and a portion of the quantum dot layer material.

According to some embodiments, the first transmissive layer, the second transmissive layer, and the third color quantum dot layer may be concurrently formed.

According to some embodiments, the first transmissive layer and the second transmissive layer may be formed through an inkjet process, and the third color quantum dot layer may be formed through a coating process.

According to some embodiments, the inkjet process may include injecting a transmissive layer material into the first opening and the second opening, and curing the transmissive layer material, and the coating process may include applying a quantum dot layer material on an entire surface of the substrate, and curing the quantum dot layer material.

According to some embodiments, the curing of the transmissive layer material may include removing a portion of the transmissive layer material.

According to some embodiments, the first transmissive layer and the second transmissive layer may be concurrently formed, and the third color quantum dot layer may be formed after the first transmissive layer and the second transmissive layer are formed.

According to some embodiments, the curing of the quantum dot layer material may include removing the quantum dot layer material covering the first transmissive layer and the second transmissive layer.

According to some embodiments, the first transmissive layer and the second transmissive layer may be formed through a coating process, and the third color quantum dot layer may be formed through an inkjet process.

According to some embodiments, the inkjet process may include injecting a quantum dot layer material into the third opening, and curing the quantum dot layer material, and the coating process may include applying a transmissive layer material on an entire surface of the substrate, and curing the transmissive layer material.

According to some embodiments, the curing of the quantum dot layer material may include removing a portion of the quantum dot layer material.

According to some embodiments, the first transmissive layer and the second transmissive layer may be concurrently formed after the third color quantum dot layer is formed.

According to some embodiments, the curing of the transmissive layer material may include removing the transmissive layer material covering the third color quantum dot layer.

According to some embodiments, the first color emission layer may be configured to emit light having a wavelength in a first wavelength band, and the second color emission layer may be configured to emit light having a wavelength in a second wavelength band.

According to some embodiments, the wavelength of the light emitted from the second color emission layer may be longer than the wavelength of the light emitted from the first color emission layer.

According to some embodiments, the third color quantum dot layer may be configured to convert the light having the wavelength in the first wavelength band and the light having the wavelength in the second wavelength band into light having a wavelength in a third wavelength band.

According to some embodiments, the first transmissive layer and the second transmissive layer may not change a wavelength of light passing therethrough.

According to some embodiments, the first color filter layer may be configured to transmit the light having the wavelength in the first wavelength band, the second color filter layer may be configured to transmit the light having the wavelength in the second wavelength band, and the third color filter layer may be configured to transmit the light having the wavelength in the third wavelength band.

Other aspects, features, and enhancements of the disclosure will become better understood through the accompanying drawings, the claims and the detailed description.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
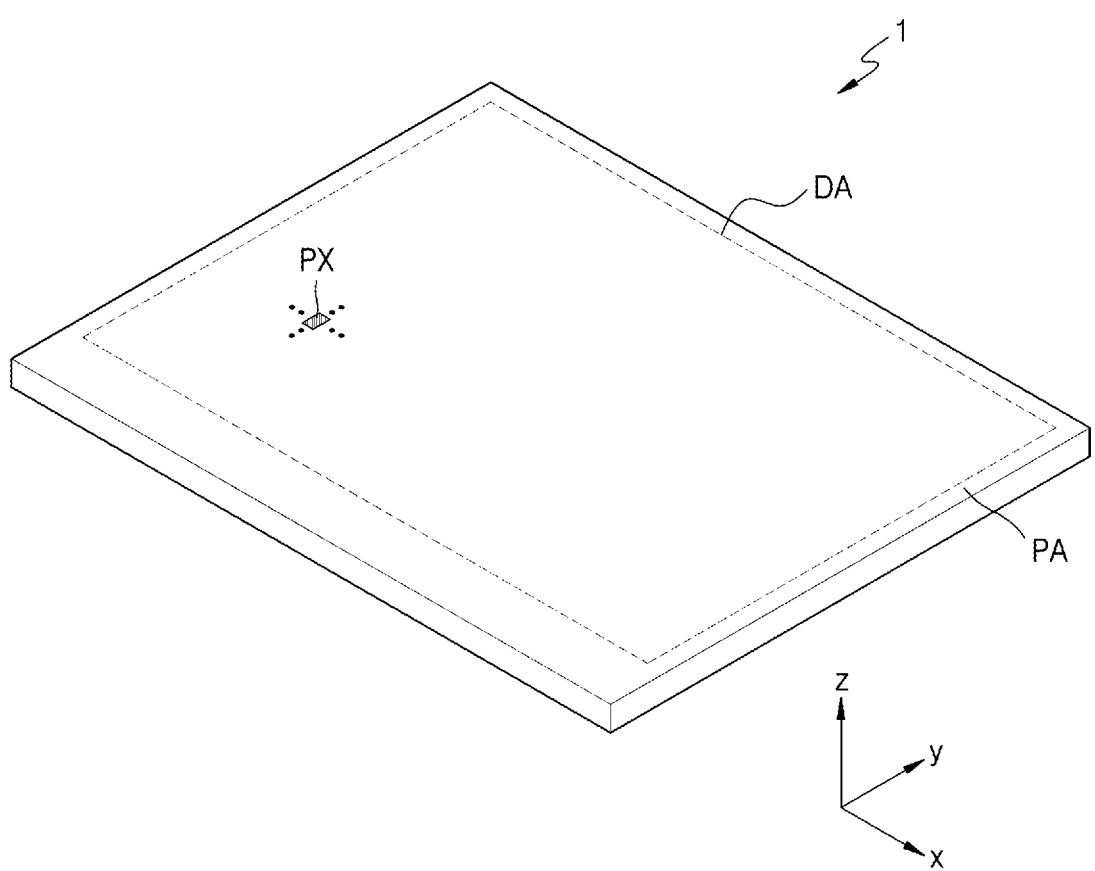
FIG. 1 is a perspective view schematically illustrating a portion of a display apparatus, according to an embodiment.

Reference will now be made in more detail to embodiments, examples of which are illustrated in the accompanying drawings, wherein like reference numerals refer to like elements throughout. In this regard, the described embodiments may be embodied in various different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. For example, the expression "A and/or B" indicates only A, only B, or both A and B. Throughout the disclosure, the expression "at least one of a, b or c" indicates only a, only b, only c, both a and b, both a and c, both b and c, all of a, b, and c, or variations thereof. Similarly, the expression "at least one of A and B" indicates only A, only B, or both A and B.

As the present description allows for various suitable changes and numerous embodiments, certain embodiments will be illustrated in the drawings and described in more detail in the written description. Effects and features of the disclosure, and methods of achieving them will be clarified with reference to embodiments described below in more detail with reference to the drawings. However, the disclosure is not limited to the following embodiments and may be embodied in various suitable forms.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include," "have," "comprises" and/or "comprising" as used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other and/or indirectly connected to each other with intervening layers, regions, or components therebetween. For example, when layers, regions, or components are referred to as being electrically connected to each other, they may be directly electrically connected to each other and/or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The embodiments of the disclosure will be described below in more detail with reference to the accompanying drawings. Those elements that are the same or are in correspondence with each other are rendered the same reference numeral regardless of the figure number, and redundant explanations thereof are omitted.

FIG. 1 is a perspective view schematically illustrating a portion of a display apparatus 1, according to an embodiment.

As illustrated in FIG. 1, the display apparatus 1 according to an embodiment may include a display area DA in which light is emitted and a peripheral area PA in which no light is emitted. A lower substrate (see 100 of FIG. 2) of the display apparatus 1 may include an area corresponding to the display area DA and an area corresponding to the peripheral area PA.

Although FIG. 1 illustrates the display apparatus 1 as having a rectangular display area DA, the disclosure is not limited thereto. For example, the display area DA may have any suitable shape, for example, a circular shape, an elliptical shape, or a polygonal shape.

In the display area DA, pixels PX may be positioned at intersections of scan lines extending in the x-axis direction and data lines extending in the y-axis direction. Each of the pixels PX may include a pixel circuit connected to the scan line and the data line, and a light-emitting element connected to the pixel circuit.

The peripheral area PA may be around (e.g., surround) at least a portion of the display area DA. For example, the peripheral area PA may completely surround the display area DA. Various lines configured to transmit electric signals to be applied to the display area DA may be positioned in the peripheral area PA. Also, a portion of a circuit configured to control electric signals to be applied to the display area DA may be positioned in the peripheral area PA.

The peripheral area PA may include a pad area at one side thereof. A pad part (e.g., a pad unit) including a plurality of pads may be on the pad area. Each of the pads included in the pad part may be electrically connected to the pads of a printed circuit board and receive signals input through the printed circuit board. The pad part may include a plurality of pads. The pads may be exposed without being covered by an insulating layer and may be electrically connected to the printed circuit board and/or the like.

The display apparatus 1 according to an embodiment includes a light-emitting element configured to emit light. In an embodiment, the light-emitting element may include an organic light-emitting diode (e.g., organic light-emitting device) including an organic material. In another embodiment, the light-emitting element may include an inorganic light-emitting diode (e.g., inorganic light-emitting device) including an inorganic material. The inorganic light-emitting diode may include a PN junction diode including inorganic semiconductor-based materials. In another embodiment, the light-emitting element may include quantum dots as an emission layer (e.g., the emission layer may include quantum dots). Hereinafter, for convenience of description, a case in which the light-emitting element of the display apparatus 1 includes an organic light-emitting diode will be mainly described. However, the disclosure is not limited to the following description. The disclosure may be equally applied to a case in which other kinds (e.g., types) of light-emitting elements are provided.

Figure 2:
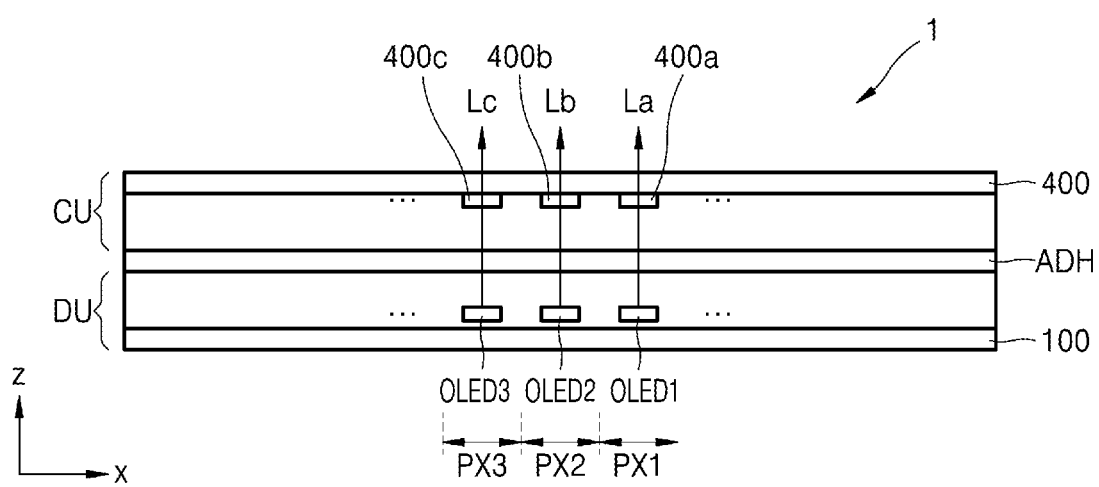
FIG. 2 is a side view schematically illustrating a portion of a display apparatus, according to an embodiment.
Figure 3:
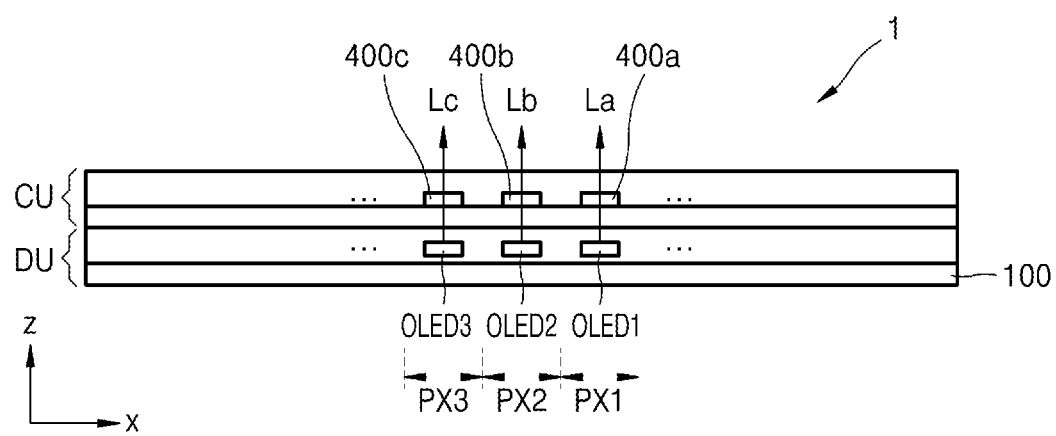
FIG. 3 is a side view schematically illustrating a portion of a display apparatus, according to another embodiment.

FIG. 2 is a side view schematically illustrating a portion of a display apparatus 1, according to an embodiment, and FIG. 3 is a side view schematically illustrating a portion of a display apparatus 1, according to another embodiment.

Referring to FIG. 2, the display apparatus 1 according to an embodiment may include a display unit DU and a color filter unit CU facing the display unit DU. The display unit DU may include a plurality of pixels. For example, the display unit DU may include a first pixel PX1, a second pixel PX2, and a third pixel PX3. The first pixel PX1, the second pixel PX2, and the third pixel PX3 may be pixels that emit lights of different colors from each other on the lower substrate 100. In an embodiment, the first pixel PX1 may be configured to emit a first color light La, the second pixel PX2 may be configured to emit a second color light Lb, and the third pixel PX3 may be configured to emit a third color light Lc. For example, the first color light La may be blue light, the second color light Lb may be green light, and the third color light Lc may be red light, but the disclosure is not limited thereto.

Each of the first, second, and third pixels PX1, PX2, and PX3 may include a light-emitting element. In an embodiment, the light-emitting element may include an organic light-emitting diode (e.g., organic light-emitting device). For example, the first pixel PX1 may include a first light-emitting element OLED1, the second pixel PX2 may include a second light-emitting element OLED2, and the third pixel PX3 may include a third light-emitting element OLED3.

In an embodiment, each of the first, second, and third light-emitting elements OLED1, OLED2, and OLED3 may be configured to emit the first color light La, for example, blue light. In another embodiment, the first, second, and third light-emitting elements OLED1, OLED2, and OLED3 may be configured to emit the first color light La, the second color light Lb, and the third color light Lc, respectively. In another embodiment, the first, second, and third light-emitting elements OLED1, OLED2, and OLED3 may be configured to emit mixed light of the first color light La and the second color light Lb, for example, mixed light of the blue light and the green light.

The color filter unit CU may include a first color filter 400a, a second color filter 400b, and a third color filter 400c. Lights from the first, second, and third light-emitting elements OLED1, OLED2, and OLED3 may be emitted as the first color light La, the second color light Lb, and the third color light Lc through the first, second, and third color filters 400a, 400b, and 400c, respectively.

In an embodiment, as illustrated in FIG. 2, the display apparatus 1 may be manufactured by separately manufacturing the display unit DU and the color filter unit CU and bonding the display unit DU and the color filter unit CU to face each other. For example, the display unit DU may be manufactured by forming the first, second, and third light-emitting elements OLED1, OLED2, and OLED3 on the lower substrate 100, and the color filter unit CU may be manufactured by forming the first, second, and third color filters 400a, 400b, and 400c on an upper substrate 400. The display unit DU and the color filter unit CU are then bonded to face each other. In this case, the display unit DU and the color filter unit CU may be bonded through an adhesive layer ADH including an optical clear adhesive (OCA) therebetween, but the disclosure is not limited thereto. For example, the adhesive layer ADH may be omitted.

In another embodiment, as illustrated in FIG. 3, the display apparatus 1 may be manufactured by directly forming the color filter unit CU on the display unit DU. For examples, the display unit DU may be manufactured by forming the first, second, and third light-emitting elements OLED1, OLED2, and OLED3 on the lower substrate 100, and the color filter unit CU may be manufactured by forming the first, second, and third color filters 400a, 400b, and 400c on the display unit DU. In this case, the display unit DU and the color filter unit CU may be formed as one body, and the upper substrate 400 may be omitted. Also, the first, second, and third color filters 400a, 400b, and 400c may be formed on an encapsulation layer (see 160 of FIG. 4). On the other hand, when necessary, an organic layer, an inorganic layer, a conductive layer, or a composite layer thereof (e.g., an organic-inorganic composite layer) may be between the first, second, and third color filters 400a, 400b, and 400c and the encapsulation layer 160.

For reference, the illustration of FIGS. 4 to 8D is based on the display apparatus 1 having the structure shown in FIG.

2, but the following descriptions may be equally applied to the display apparatus 1 having the structure shown in FIG. 3.

Figure 4:
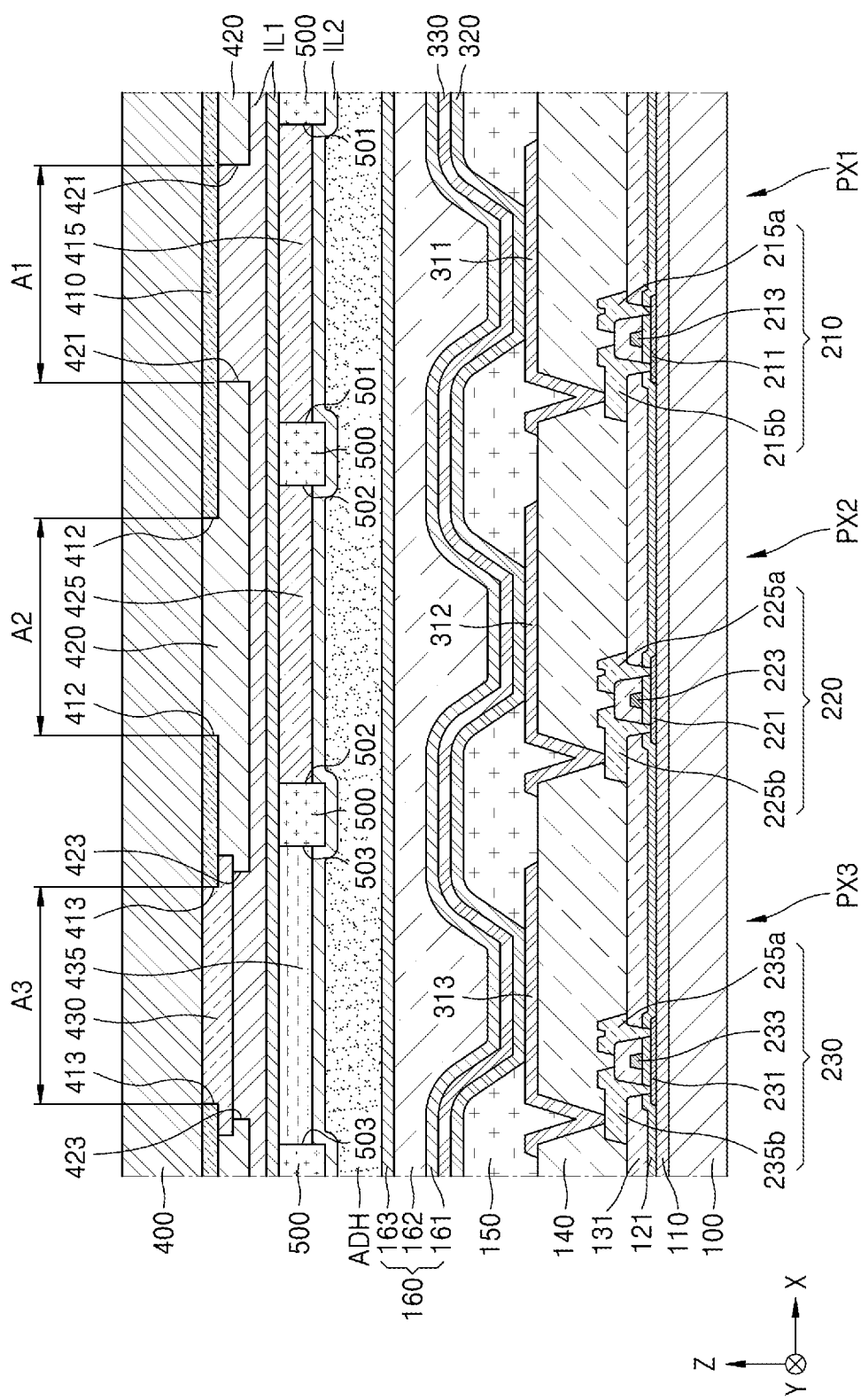
FIG. 4 is a cross-sectional view schematically illustrating a portion of a display apparatus, according to an embodiment.

FIG. 4 is a cross-sectional view schematically illustrating a portion of a display apparatus 1, according to an embodiment.

The display apparatus (see 1 of FIG. 2) according to an embodiment may include a lower substrate 100, light-emitting elements on the lower substrate 100, an upper substrate 400, and color filters on the lower surface of the upper substrate 400 in a direction of the lower substrate 100 (e.g., in a thickness direction of the display apparatus, e.g., the z direction of FIG. 4).

The lower substrate 100 may include glass, a metal, and/or a polymer resin. When the lower substrate 100 is flexible and/or bendable, the lower substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. However, the present disclosure is not limited thereto, and the lower substrate 100 may be variously suitably modified. For example, the lower substrate 100 may have a multilayer structure that includes two layers including the above-described polymer resin and a barrier layer between the two layers and including an inorganic material such as silicon oxide, silicon nitride, and/or silicon oxynitride.

A first light-emitting element including a first pixel electrode 311 is positioned on the lower substrate 100. In some embodiments, in addition to the first light-emitting element, a first thin-film transistor 210 electrically connected to the first light-emitting element may also be positioned on the lower substrate 100. When the first light-emitting element is electrically connected to the first thin-film transistor 210, the first pixel electrode 311 of the first light-emitting element is electrically connected to the first thin-film transistor 210.

The first thin-film transistor 210 may include a first semiconductor layer 211, a first gate electrode 213, a first source electrode 215a, and a first drain electrode 215b. The first semiconductor layer 211 may include amorphous silicon, polycrystalline silicon, an organic semiconductor material, and/or an oxide semiconductor material. The first gate electrode 213 may include various suitable conductive materials and may have various suitable single-layer structures or multilayer structures. For example, the first gate electrode 213 may include a Mo layer, an Al layer, and/or a Ti layer. Also, the first gate electrode 213 may have a three-layer structure of a Mo layer/Al layer/Mo layer. The first source electrode 215a and the first drain electrode 215b also may include various suitable conductive materials and may have various suitable layered structures. For example, the first source electrode 215a and the first drain electrode 215b may include a Ti layer, an Al layer, and/or a Cu layer. Also, the first source electrode 215a and the first drain electrode 215b may have a three-layer structure of a Ti layer/Al layer/Ti layer.

In order to secure insulation between the first semiconductor layer 211 and the first gate electrode 213, a gate insulating layer 121 may be between the first semiconductor layer 211 and the first gate electrode 213. Also, an interlayer insulating layer 131 may be on the first gate electrode 213, and the first source electrode 215a and the first drain electrode 215b may be on the interlayer insulating layer 131. The gate insulating layer 121 and the interlayer insulating layer 131 may include an inorganic material such as silicon oxide, silicon nitride, and/or silicon oxynitride, and may be formed through chemical vapor deposition (CVD) and/or atomic layer deposition (ALD).

A buffer layer 110 including an inorganic material such as silicon oxide, silicon nitride, and/or silicon oxynitride may be between the first thin-film transistor 210 and the lower substrate 100. The buffer layer 110 may increase the smoothness of the upper surface of the lower substrate 100 and/or may reduce or prevent infiltration of impurities into the light-emitting element and the pixel circuit.

A planarization layer 140 may be on the first thin-film transistor 210. The planarization layer 140 may substantially planarize an upper portion of a protective layer covering the first thin-film transistor 210. The planarization layer 140 may include an organic material such as acryl, benzocyclobutene (BCB), and/or hexamethyldisiloxane (HMDSO). Although FIG. 4 illustrates that the planarization layer 140 is a single layer, various suitable modifications may be made thereto. For example, the planarization layer 140 may have a multilayer structure.

The first light-emitting element may be on the planarization layer 140 of the lower substrate 100. In an embodiment, the first light-emitting element positioned in the first pixel PX1 may be an organic light-emitting diode having a first pixel electrode 311, an opposite electrode 330, and an intermediate layer 320 therebetween. The first pixel electrode 311 may be in contact with one of the first source electrode 215a and the first drain electrode 215b through a contact hole formed in the planarization layer 140 and/or the like and may be thereby electrically connected to the first thin-film transistor 210. The first pixel electrode 311 may include a transmissive conductive layer including a transmissive conductive oxide such as indium tin oxide (ITO), $In_2O_3$, and/or indium zinc oxide (IZO), and a reflective layer including a metal such as Al and/or Ag. For example, the first pixel electrode 311 may have a three-layer structure of an ITO layer/Ag layer/ITO layer.

In an embodiment, the intermediate layer 320 and/or the opposite electrode 330 may be formed as one body (e.g., as a common layer) with respect to the first, second, and third pixel electrodes 311, 312, and 313. In another embodiment, the intermediate layer 320 and/or the opposite electrode 330 may have a patterned shape to correspond to each of the first, second, and third pixel electrodes 311, 312, and 313. That is, the intermediate layer 320 and/or the opposite electrode 330 may not be formed as a common layer.

The intermediate layer 320 may include a low molecular weight material or a high molecular weight material. When the intermediate layer 320 includes a low molecular weight material, the intermediate layer 320 may have a structure in which a hole injection layer (HIL), a hole transport layer (HTL), an emission layer (EML), an electron transport layer (ETL), and an electron injection layer (EIL) are stacked in a single structure or complex structure (e.g., a tandem structure), and may be formed by vacuum deposition. When the intermediate layer 320 includes a high molecular weight material, the intermediate layer 320 may have a structure including an HTL and an emission layer. In this case, the HTL may include, for example, poly(3,4-ethylenedioxythiophene) (PEDOT), and the emission layer may include, for example, a polymer material such as poly-phenylenevinylene (PPV) and/or polyfluorene. The intermediate layer 320 may be formed by screen printing, inkjet printing, deposition, and/or laser induced thermal imaging (LITI). However, the intermediate layer 320 is not necessarily limited thereto, and may have various suitable structures.

The intermediate layer 320 may further include a plurality of emission layers and a charge generation layer (CGL)

therebetween. In an embodiment, the intermediate layer 320 may include at least one first color emission layer (see EMLa of FIG. 5) and at least one second color emission layer (see EMLb of FIG. 5). The detailed configuration of the intermediate layer 320 will be described later in more detail with reference to FIG. 5.

The opposite electrode 330 may include a transmissive conductive layer including ITO, $In_2O_3$, and/or IZO. Also, the opposite electrode 330 may include a semi-transmissive layer including a metal such as Al, Mg, and/or Ag.

A pixel defining layer 150 may be on the planarization layer 140. The pixel defining layer 150 may have pixel openings corresponding to the respective pixels and exposing at least some (e.g., a portion of the) pixel electrodes to define the pixels. The pixel defining layer 150 may include an organic material such as polyimide and/or HMDSO.

Because the light-emitting elements may be damaged by external moisture and/or oxygen, the light-emitting elements may be covered and protected by the encapsulation layer 160. The encapsulation layer 160 may include at least one organic encapsulation layer and at least one inorganic encapsulation layer. For example, the encapsulation layer 160 may include a first inorganic encapsulation layer 161, an organic encapsulation layer 162, and a second inorganic encapsulation layer 163.

The first inorganic encapsulation layer 161 may cover the opposite electrode 330. Other layers such as a capping layer may be between the first inorganic encapsulation layer 161 and the opposite electrode 330. Because the first inorganic encapsulation layer 161 is formed along the structure therebelow, the upper surface of the first inorganic encapsulation layer 161 may not be flat. Therefore, the organic encapsulation layer 162 may be formed to cover the first inorganic encapsulation layer 161 so that the upper surface of the first inorganic encapsulation layer 161 may be flat. The organic encapsulation layer 162 may be covered with the second inorganic encapsulation layer 163.

The first inorganic encapsulation layer 161 and the second inorganic encapsulation layer 163 may each include silicon oxide, silicon nitride, and/or silicon trioxynitride. The organic encapsulation layer 162 may include one or more materials selected from polyethylene terephthalate, polyethylene naphthalate, polycarbonate, polyimide, polyethylene sulfonate, polyoxymethylene, polyarylate, and hexamethyldisiloxane.

As illustrated in FIG. 4, the display apparatus according to the present embodiment may include a second light-emitting element positioned in the second pixel PX2. The second light-emitting element may include an organic light-emitting diode having a second pixel electrode 312, an opposite electrode 330, and an intermediate layer 320 therebetween. In addition to the second light-emitting element, a second thin-film transistor 220 electrically connected to the second light-emitting element may also be positioned on the lower substrate 100. When the second light-emitting element is electrically connected to the second thin-film transistor 220, the second pixel electrode 312 of the second light-emitting element is electrically connected to the second thin-film transistor 220. The description of the second pixel electrode 312 and the second thin-film transistor 220 may refer to the above description of the first pixel electrode 311 and the first thin-film transistor 210.

Also, as illustrated in FIG. 4, the display apparatus according to the present embodiment may include a third light-emitting element positioned in the third pixel PX3. The third light-emitting element may include an organic light-emitting diode having a third pixel electrode 313, an opposite electrode 330, and an intermediate layer 320 therebetween. In addition to the third light-emitting element, a third thin-film transistor 230 electrically connected to the third light-emitting element may also be positioned on the lower substrate 100. When the third light-emitting element is electrically connected to the third thin-film transistor 230, the third pixel electrode 313 of the third light-emitting element is electrically connected to the third thin-film transistor 230. The description of the third pixel electrode 313 and the third thin-film transistor 230 may refer to the above description of the first pixel electrode 311 and the first thin-film transistor 210.

The upper substrate 400 may be on the lower substrate 100 so that the lower surface of the upper substrate 400 faces the lower substrate 100. The upper substrate 400 may be arranged such that the first, second, and third pixel electrodes 311, 312, and 313 are between the upper substrate 400 and the lower substrate 100.

The upper substrate 400 may include a polymer resin. The upper substrate 400 may include, for example, a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. However, the present disclosure is not limited thereto, and the upper substrate 400 may be variously suitably modified. For example, the upper substrate 400 may have a multilayer structure that includes two layers including the above-described polymer resin and a barrier layer between the two layers and including an inorganic material such as silicon oxide, silicon nitride, and/or silicon oxynitride.

The upper substrate 400 may include a first area A1 corresponding to the first pixel electrode 311, a second area A2 corresponding to the second pixel electrode 312, and a third area A3 corresponding to the third pixel electrode 313. The term "corresponding" refers to overlapping each other when viewed from a direction (z-axis direction) perpendicular to the upper substrate 400 (e.g., in a plan view). That is, when viewed from the direction (z-axis direction) perpendicular to the upper substrate 400, the first area A1 overlaps the first pixel electrode 311, the second area A2 overlaps the second pixel electrode 312, and the third area A3 overlaps the third pixel electrode 313.

Color filters may be on the lower surface of the upper substrate 400 in a direction (−z-axis direction) of the lower substrate 100. In an embodiment, the color filters may include first, second, and third color filters 400a, 400b, and 400c corresponding to the first, second, and third pixels PX1, PX2, and PX3, respectively. When viewed from the direction (z-axis direction) perpendicular to the lower substrate 100 or the upper substrate 400 (e.g., in a plan view), the first, second, and third color filters 400a, 400b, and 400c may overlap the first, second, and third pixel electrodes 311, 312, and 313, respectively. The first, second, and third color filters 400a, 400b, and 400c filter lights emitted from the first, second, and third light-emitting elements, respectively. Therefore, the display apparatus may display a full-color image.

In an embodiment, the first color filter 400a may include a first transmissive layer 415 between the upper substrate 400 and the opposite electrode 330, and a first color filter layer 410 between the upper substrate 400 and the first transmissive layer 415 in the first area A1. The second color filter 400b may include a second transmissive layer 425 between the upper substrate 400 and the opposite electrode 330, and a second color filter layer 420 between the upper substrate 400 and the second transmissive layer 425 in the second area A2. The third color filter 400c may include a third color quantum dot layer 435 between the upper substrate 400 and the opposite electrode 330, and a third color filter layer 430 between the upper substrate 400 and the third color quantum dot layer 435 in the third area A3.

The first color filter layer 410 may be configured to transmit only light having a wavelength in a first wavelength band (e.g., a first wavelength range). For example, the first color filter layer 410 may be configured to transmit only light having a wavelength of about 450 nm to about 495 nm. The first color filter layer 410 may be on the lower surface of the upper substrate 400 in the direction (–z-axis direction) of the lower substrate 100. The first color filter layer 410 may cover the first area A1 of the upper substrate 400.

In some embodiments, as illustrated in FIG. 4, the first color filter layer 410 may have a $(1-2)^{nd}$ opening 412 exposing the second area A2. The $(1-2)^{nd}$ opening 412 may define an area corresponding to the second pixel PX2. Also, the first color filter layer 410 may have a $(1-3)^{rd}$ opening 413 exposing the third area A3 corresponding to the third pixel electrode 313. The $(1-3)^{rd}$ opening 413 may define an area corresponding to the third pixel PX3.

The second color filter layer 420 may be configured to transmit only light having a wavelength in a second wavelength band (e.g., a second wavelength range). For example, the second color filter layer 420 may be configured to transmit only light having a wavelength of about 495 nm to about 570 nm. The second color filter layer 420 may include a portion positioned on the lower surface of the first color filter layer 410 in the direction (–z-axis direction) of the lower substrate 100, and a portion filling the $(1-2)^{nd}$ (e.g., first-second) openings 412 of the first color filter layer 410. A portion of the second color filter layer 420 positioned on the lower surface of the first color filter layer 410 in the direction (–z-axis direction) of the lower substrate 100 may serve as a partition wall that does not transmit light. A portion of the second color filter layer 420 that fills the $(1-2)^{nd}$ opening 412 of the first color filter layer 410 may cover the second area A2 of the upper substrate 400.

In some embodiments, the second color filter layer 420 has a $(2-1)^{st}$ opening 421 exposing the first area A1. The $(2-1)^{st}$ opening 421 may define an area corresponding to the first pixel PX1. Also, the second color filter layer 420 has a $(2-3)^{rd}$ opening 423 exposing the third area A3 corresponding to the third pixel electrode 313.

The third color filter layer 430 may be configured to transmit only light having a wavelength in a third wavelength band (e.g., a third wavelength range). For example, the third color filter layer 430 may be configured to transmit only light having a wavelength of about 630 nm to about 780 nm. The third color filter layer 430 fills the $(1-3)^{rd}$ opening 413 of the first color filter layer 410. However, the present disclosure is not limited thereto, and it may be understood that the third color filter layer 430 may fills the $(2-3)^{rd}$ opening 423 of the second color filter layer 420. The third color filter layer 430 may cover the third area A3 of the upper substrate 400.

The first, second, and third color filter layers 410, 420, and 430 may reduce the reflection of external light in the display apparatus. For example, when external light reaches the first color filter layer 410, only light having a preset wavelength passes through the first color filter layer 410 and lights having the other wavelengths are absorbed by the first color filter layer 410. Therefore, only light having a preset wavelength among external light incident on the display apparatus passes through the first color filter layer 410, and a portion thereof is reflected from the opposite electrode 330 and/or the first pixel electrode 311 therebelow and emitted again to the outside. As a result, only a portion of external light incident to a location at which the first pixel PX1 is arranged is reflected to the outside, thereby reducing the reflection of external light. These descriptions may be equally applied to the second color filter layer 420 and the third color filter layer 430.

FIG. 4 illustrates that the $(2-1)^{st}$ opening 421 of the second color filter layer 420 defines the first area A1, the $(1-2)^{nd}$ opening 412 of the first color filter layer 410 defines the second area A2, and the $(1-3)^{rd}$ opening 413 of the first color filter layer 410 defines the third area A3, but the disclosure is not limited thereto.

In another embodiment, a black matrix may be between the first, second, and third color filter layers 410, 420, and 430. Because the black matrix has openings corresponding to the first, second, and third areas A1, A2, and A3, areas of the first, second, and third pixels PX1, PX2, and PX3 may be defined. The black matrix may include the same material as a material of a bank 500 to be described later. For example, the black matrix may include an inorganic material such as silicon oxide, silicon nitride, and/or silicon oxynitride. Also, the black matrix may include a photoresist material. In this case, the black matrix may be easily formed through processes such as light exposure and development.

The bank 500 may be between the overlapping portion of the color filter layers and the lower substrate 100. In an embodiment, the bank 500 may overlap a portion where the first color filter layer 410 and the second color filter layer 420 overlap each other. In another embodiment, when the display apparatus includes the above-described black matrix, the bank 500 may overlap the black matrix.

The bank 500 may have a first opening 501 corresponding to the first area A1, a second opening 502 corresponding to the second area A2, and a third opening 503 corresponding to the third area A3. The first, second, and third openings 501, 502, and 503 of the bank 500 may overlap pixel openings of the pixel defining layer 150 defining the areas of the first, second, and third pixels PX1, PX2, and PX3. In an embodiment, when viewed from a direction perpendicular to the lower substrate 100 or the upper substrate 400 (e.g., in a plan view), the edge shape of each of the first, second, and third openings 501, 502, and 503 of the bank 500 may be identical to or similar to the edge shape of each of the pixel openings of the pixel defining layer 150.

The bank 500 may include an inorganic material such as silicon oxide, silicon nitride, and/or silicon oxynitride. In an embodiment, the bank 500 may include a photoresist material. In this case, the bank 500 may be easily formed through processes such as light exposure and development.

The openings of the bank 500 may be filled with a quantum dot layer or a transmissive layer. The "quantum dot layer" includes quantum dots that convert the wavelength of light, and light passing through the quantum dot layer is converted into light in a preset wavelength band (e.g., a preset wavelength range). The "transmissive layer" does not include the above-described quantum dots, and the wavelength of light passing through the transmissive layer is not converted (e.g., is not changed).

In an embodiment, the first pixel PX1 and the second pixel PX2 may not include the quantum dot layer, and only the third pixel PX3 may include the quantum dot layer. For example, the first transmissive layer 415 fills at least a portion of the first opening 501 of the bank 500 and overlaps the first pixel electrode 311. The second transmissive layer 425 fills at least a portion of the second opening 502 of the bank 500 and overlaps the second pixel electrode 312. The third color quantum dot layer 435 fills at least a portion of the third opening 503 of the bank 500 and overlaps the third pixel electrode 313.

In this case, in the first pixel PX1, light from the first light-emitting element passes through the first transmissive layer 415 without wavelength conversion and is emitted toward the first color filter layer 410. In the second pixel PX2, light from the second light-emitting element passes through the second transmissive layer 425 without wavelength conversion and is emitted toward the second color filter layer 420. In the third pixel PX3, light from the third light-emitting element passes through the third color quantum dot layer 435, is converted into light having a wavelength band corresponding to the third color, and is emitted toward the third color filter layer 430.

The first transmissive layer 415 and the second transmissive layer 425 may include the same material. Also, the first transmissive layer 415 and the second transmissive layer 425 may be concurrently or simultaneously formed in a single process. The first transmissive layer 415 and the second transmissive layer 425 may include a transmissive resin such as acryl, BCB, and/or HMDSO.

The third color quantum dot layer 435 may convert light of the first wavelength band and light of the second wavelength band, which are generated in the intermediate layer 320 on the third pixel electrode 313, into light of the third wavelength band. For example, the third color quantum dot layer 435 may convert light having a wavelength band of 450 nm to 495 nm and/or light having a wavelength band of 495 nm to 570 nm, which are generated in the intermediate layer 320 on the third pixel electrode 313, into light having a wavelength band of 630 nm to 780 nm.

The third color quantum dot layer 435 may include a plurality of quantum dots dispersed in a resin. The quantum dots include a semiconductor material such as cadmium sulfide (CdS), cadmium telluride (CdTe), zinc sulfide (ZnS), and/or indium phosphide (InP). The size of the quantum dots may be several nanometers, and the wavelength of light after conversion varies according to the size of the quantum dots. Also, the third color quantum dot layer 435 may include any suitable resin as long as the resin is a transmissive material. For example, a polymer resin such as acryl, BCB, and/or HMDSO may be utilized as a material for forming the third color quantum dot layer 435. In an embodiment, the third color quantum dot layer 435 may include an ink composition including a plurality of quantum dots, a monomer having a photopolymerization functional group, and a photopolymerization initiator. Also, the quantum dots included in the third color quantum dot layer 435 may include one or more kinds (e.g., types) of ligands surrounding the surfaces of the quantum dots. The kind (e.g., type) of ligand is not limited. For example, the ligand may include a mono-dentate ligand, a bi-dentate ligand, and/or a poly-dentate ligand.

In an embodiment, the upper surface of each of the first transmissive layer 415, the second transmissive layer 425, and the third color quantum dot layer 435 may have a step difference from the upper surface of the bank 500. Referring to FIG. 4, a distance from the lower surface of the upper substrate 400 in the direction of the lower substrate 100 (e.g., −z direction) to the lower surface of each of the first transmissive layer 415, the second transmissive layer 425, and the third color quantum dot layer 435 in the direction of the lower substrate 100 may be less than a distance from the lower surface of the upper substrate 400 in the direction of the lower substrate 100 to the lower surface of the bank 500 in the direction of the lower substrate 100.

A first protective layer IL1 may be between the first color filter layer 410 and the first transmissive layer 415, between the second color filter layer 420 and the second transmissive layer 425, and between the third color filter layer 430 and the third color quantum dot layer 435. Also, a second protective layer IL2 may be arranged to cover the lower surface of each of the first transmissive layer 415, the second transmissive layer 425, the third color quantum dot layer 435, and the bank 500 in the direction of the lower substrate 100. Also, the first protective layer IL1 and the second protective layer IL2 may be integral (e.g., formed as a common layer) over the entire surface of the upper substrate 400.

The first protective layer IL1 and the second protective layer IL2 may include a transmissive inorganic insulating material such as silicon oxide, silicon nitride, and/or silicon oxynitride. Also, the first protective layer IL1 and the second protective layer IL2 may include a layer including one or more materials selected from polyethylene terephthalate, polyethylene naphthalate, polycarbonate, polyimide, polyethylene sulfonate, polyoxymethylene, polyarylate, and hexamethyldisiloxane. In an embodiment, the first protective layer IL1 may further include an organic material layer covering the lower surfaces of the first, second, and third color filter layers 410, 420, and 430 in the direction of the lower substrate 100. In this case, due to the organic material layer, the first protective layer IL1 may have a flat lower surface.

Figure 5:
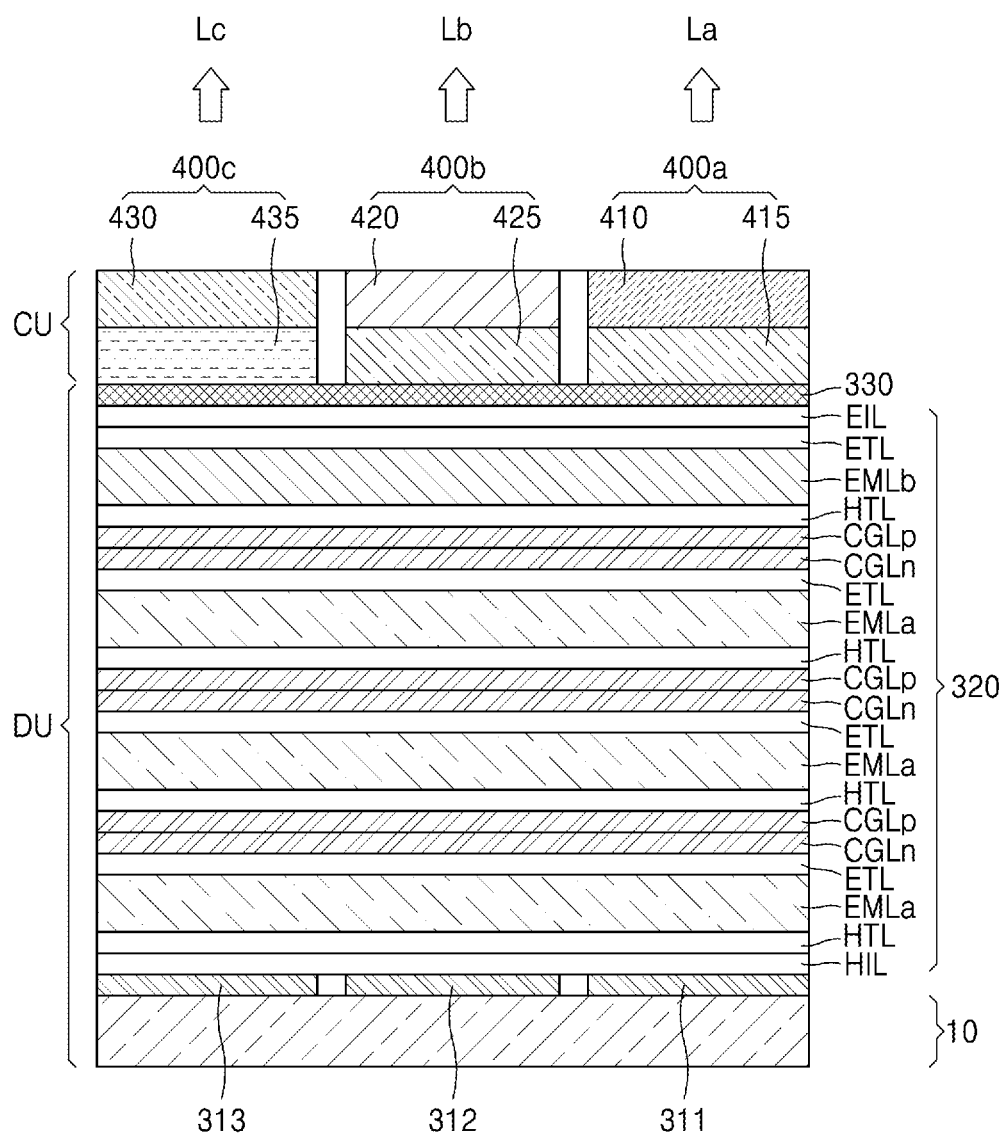
FIG. 5 is a cross-sectional view schematically illustrating a portion of an intermediate layer included in a display apparatus, according to an embodiment.

FIG. 5 is a cross-sectional view schematically illustrating a portion of an intermediate layer included in a display apparatus, according to an embodiment.

As illustrated in FIG. 5, the display apparatus (see 1 of FIG. 1) according to an embodiment may include a thin-film transistor array substrate 10 including the above-described thin-film transistors. First, second, and third light-emitting elements may be on the thin-film transistor array substrate 10. The first, second, and third light-emitting elements may respectively include the first, second, and third pixel electrodes 311, 312, and 313, the intermediate layer 320, and the opposite electrode 330. The first, second, and third color filters 400a, 400b, and 400c corresponding to the first, second, and third pixels PX1, PX2, and PX3, respectively, may be on the opposite electrode 330. Lights from the emission layers included in the intermediate layer 320 pass through the first, second, and third color filters 400a, 400b, and 400c arranged on the opposite electrode 330, are filtered, and are then emitted to the outside.

The intermediate layer 320 provided in the first, second, and third light-emitting elements may have a tandem structure in which a plurality of light-emitting units each including an emission layer are sequentially stacked. The term "light-emitting unit" as used herein refers to a unit including at least one of a hole injection layer HIL, a hole transport layer HTL, an electron transport layer ETL, and an electron injection layer EIL together with the emission layer. For example, the first color light-emitting unit may include a structure in which a hole transport layer HTL, a first color emission layer EMLa, and an electron transport layer ETL are sequentially stacked, and the second color light-emitting unit may include a structure in which a hole transport layer HTL, a second color emission layer EMLb, and an electron transport layer ETL are sequentially stacked.

The first color emission layer EMLa may be configured to emit light having a first wavelength band, and the second color emission layer EMLb may be configured to emit light having a second wavelength band. In an embodiment, the wavelength of light emitted from the second color emission layer EMLb may be longer than the wavelength of light emitted from the first color emission layer EMLa. For example, the first color emission layer EMLa may be configured to emit light having a wavelength band of about 450 nm to about 495 nm, and the second color emission layer EMLb may be configured to emit light having a wavelength band of about 495 nm to about 570 nm.

In an embodiment, the intermediate layer 320 may include at least one first color light-emitting unit and at least one second color light-emitting unit. In this regard, FIG. 5 illustrates a case in which the intermediate layer 320 includes three first color light-emitting units and one second color light-emitting unit, which are sequentially stacked, but the number of first color light-emitting units and the number of second color light-emitting units included in the intermediate layer 320 and the arrangement thereof are not limited. For example, unlike in FIG. 5, the intermediate layer 320 may include one, two, or four or more first color light-emitting units, or two or more second color light-emitting units. Also, the second color light-emitting unit may be between the first color light-emitting units, or the second color light-emitting unit may be the lowest, and the first color light-emitting unit(s) may be sequentially stacked on the second color light-emitting unit.

A charge generation layer (CGL) may be between the light-emitting units. The CGL is a layer that provides electrons or holes, and may increase the luminescence efficiency of adjacent emission layers. The CGL may include an n-type charge generation layer CGLn configured to provide electrons and a p-type charge generation layer CGLp configured to provide holes. For example, as illustrated in FIG. 5, the n-type charge generation layer CGLn may be on the electron transport layer ETL of the light-emitting unit to provide electrons to the electron transport layer ETL, and the p-type charge generation layer CGLp may be below the hole transport layer HTL of the light-emitting unit to provide holes to the hole transport layer HTL. The CGL may include a metal material.

Hereinafter, a method of manufacturing the above-described display apparatus will be described in more detail.

Figure 6A:
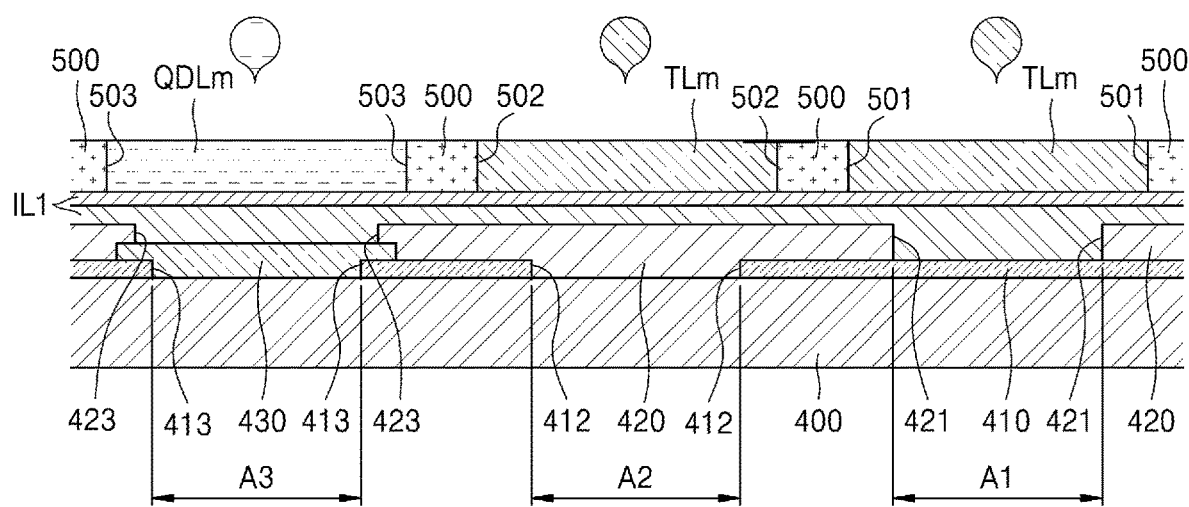
FIGS. 6A and 6B are cross-sectional views sequentially illustrating a part of a method of manufacturing a display apparatus, according to an embodiment.
Figure 6B:
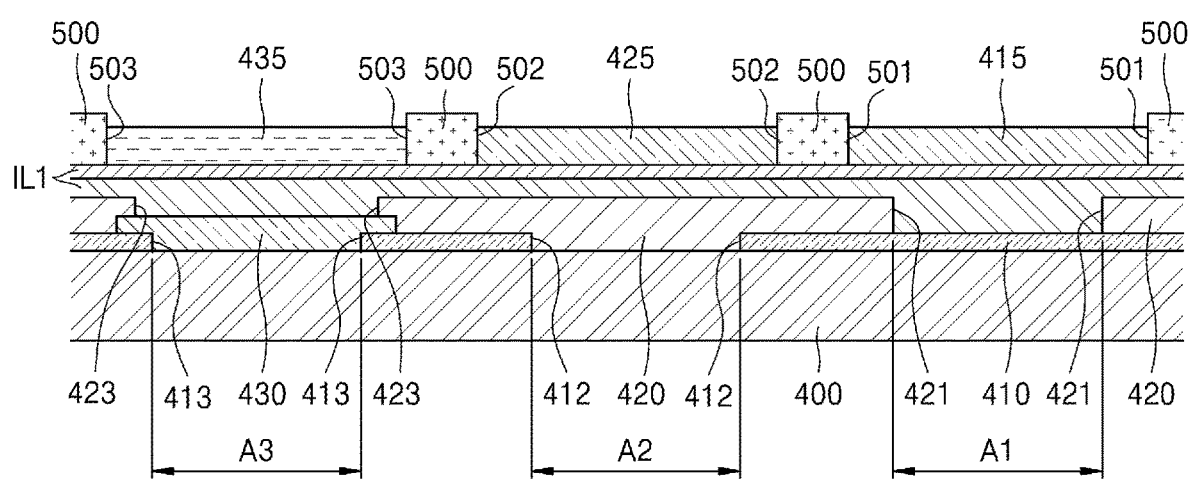

FIGS. 6A and 6B are cross-sectional views sequentially illustrating a part of a method of manufacturing a display apparatus, according to an embodiment, FIGS. 7A to 7D are cross-sectional views sequentially illustrating a part of a method of manufacturing a display apparatus, according to another embodiment, and FIGS. 8A to 8D are cross-sectional views sequentially illustrating a part of a method of manufacturing a display apparatus, according to another embodiment.

Although FIGS. 6A to 8D illustrate manufacturing methods in which a display unit (see DU of FIG. 2) and a color filter unit (see CU of FIG. 2) are separately manufactured and attached to each other, as illustrated in FIG. 2, the following description may be equally applied to a case in which a color filer unit (see CU of FIG. 3) is directly formed on a display unit (see DU of FIG. 3), as illustrated in FIG. 3. In this case, unlike those illustrated in FIGS. 6A to 8D, the display unit DU, not the color filter layers and the upper substrate 400, is arranged below the first transmissive layer 415, the second transmissive layer 425, and the third color quantum dot layer 435 (e.g., according to the orientation shown in these figures).

The method of manufacturing the display apparatus, according to an embodiment, may include forming color filter layers, forming a bank, and forming a transmissive layer and a quantum dot layer.

The forming of the color filter layers includes forming a first color filter layer 410 in a first area A1 of an upper substrate 400, a second color filter layer 420 in a second area A2 of the upper substrate 400, and a third color filter layer 430 in a third area A3 of the upper substrate 400.

The forming of the bank includes forming a bank 500 having a first opening 501 overlapping the first area A1, a second opening 502 overlapping the second area A2, and a third opening 503 overlapping the third area A3.

The forming of the transmissive layer and the quantum dot layer includes forming a first transmissive layer 415 filling at least a portion of the first opening 501, a second transmissive layer 425 filling at least a portion of the second opening 502, and a third color quantum dot layer 435 filling at least a portion of the third opening 503. The first transmissive layer 415 and the second transmissive layer 425 may include the same material and may be concurrently or simultaneously formed in a single process.

Hereinafter, in the method of manufacturing the display apparatus, according to various embodiments, the forming of the first transmissive layer 415, the second transmissive layer 425, and the third color quantum dot layer 435 will be described in more detail.

Referring to FIGS. 6A and 6B, in the method of manufacturing the display apparatus, according to an embodiment, the first transmissive layer 415, the second transmissive layer 425, and the third color quantum dot layer 435 may be formed through an inkjet process.

The inkjet process may include: injecting a transmissive layer material TLm into the first opening 501 and the second opening 502 of the bank 500 and injecting a quantum dot layer material QDLm into the third opening 503 of the bank 500; and curing the transmissive layer material TLm and the quantum dot layer material QDLm.

Referring to FIG. 6A, the transmissive layer material TLm and the quantum dot layer material QDLm may be injected into the first, second, and third openings 501, 502, and 503 through nozzles arranged to correspond to the first, second, and third openings 501, 502, and 503, respectively. In an embodiment, the first transmissive layer 415, the second transmissive layer 425, and the third color quantum dot layer 435 may be concurrently or simultaneously formed. That is, the transmissive layer material TLm or the quantum dot layer material QDLm may be concurrently or simultaneously injected into the first, second, and third openings 501, 502, and 503 and then cured. In addition, the first transmissive layer 415 and the second transmissive layer 425 may include the same material.

Referring to FIG. 6B, in the curing of the transmissive layer material TLm and the quantum dot layer material QDLm, a portion of the transmissive layer material TLm injected into the first opening 501 and the second opening 502 and a portion of the quantum dot layer material QDLm injected into the third opening 503 may be removed. Therefore, in the cross-sectional view, the thicknesses of the first transmissive layer 415, the second transmissive layer 425, and the third color quantum dot layer 435 may be less than the thickness of the bank 500. Because the upper surfaces of the first transmissive layer 415, the second transmissive layer 425, and the third color quantum dot layer 435 have a step difference from the upper surface of the bank 500, mixing of colors between pixels may be prevented or substantially prevented.

Referring to FIGS. 7A to 7D, in the method of manufacturing the display apparatus, according to an embodiment, after the first transmissive layer 415 and the second transmissive layer 425 are formed through an inkjet process, the third color quantum dot layer 435 may be formed through a coating process.

The inkjet process may include injecting the transmissive layer material TLm into the first opening 501 and the second opening 502, and curing the transmissive layer material TLm.

Figure 7A:
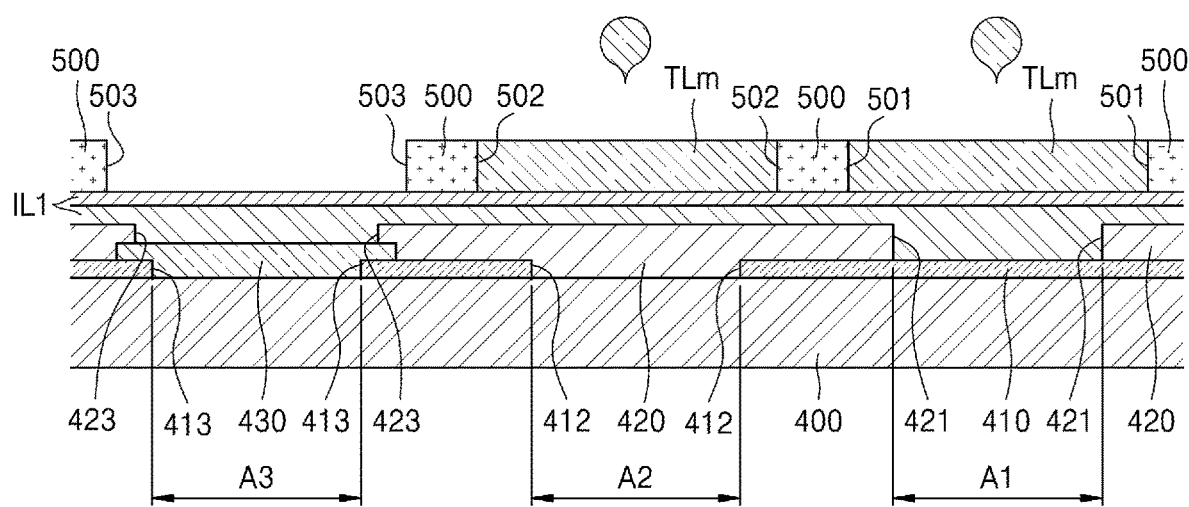
FIGS. 7A to 7D are cross-sectional views sequentially illustrating a part of a method of manufacturing a display apparatus, according to another embodiment.

Referring to FIG. 7A, the transmissive layer material TLm may be injected into the first opening 501 and the second opening 502 in an ink form through nozzles arranged to correspond to the first opening 501 and the second opening 502. In an embodiment, the first transmissive layer 415 and the second transmissive layer 425 may be concurrently or simultaneously formed. That is, the transmissive layer material TLm may be concurrently or simultaneously injected into the first opening 501 and the second opening 502 and then cured. In addition, the first transmissive layer 415 and the second transmissive layer 425 may include the same material.

Figure 7B:
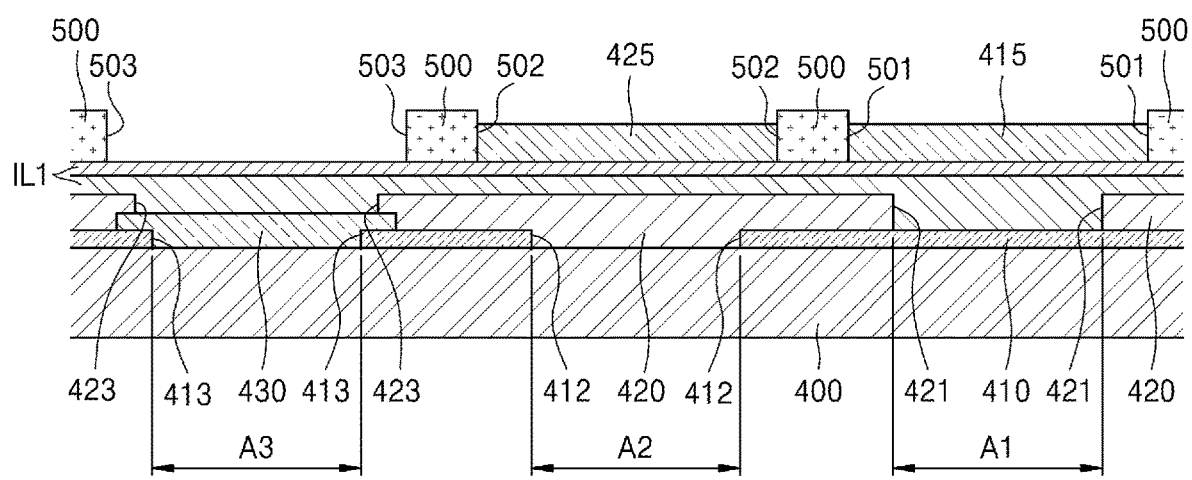

Referring to FIG. 7B, in the curing of the transmissive layer material TLm, a portion of the transmissive layer material TLm injected into the first opening 501 and the second opening 502 may be removed. Therefore, in the cross-sectional view, the thicknesses of the first transmissive layer 415 and the second transmissive layer 425 may be less than the thickness of the bank 500. Because the upper surfaces of the first transmissive layer 415 and the second transmissive layer 425 have a step difference from the upper surface of the bank 500, mixing of colors between pixels may be prevented or substantially prevented.

The coating process may include applying the quantum dot layer material QDLm on the entire surface of the upper substrate 400 and curing the quantum dot layer material QDLm. In an embodiment, the coating process may be performed after the inkjet process. In this case, the third color quantum dot layer 435 may be formed after the first transmissive layer 415 and the second transmissive layer 425 are formed.

Figure 7C:
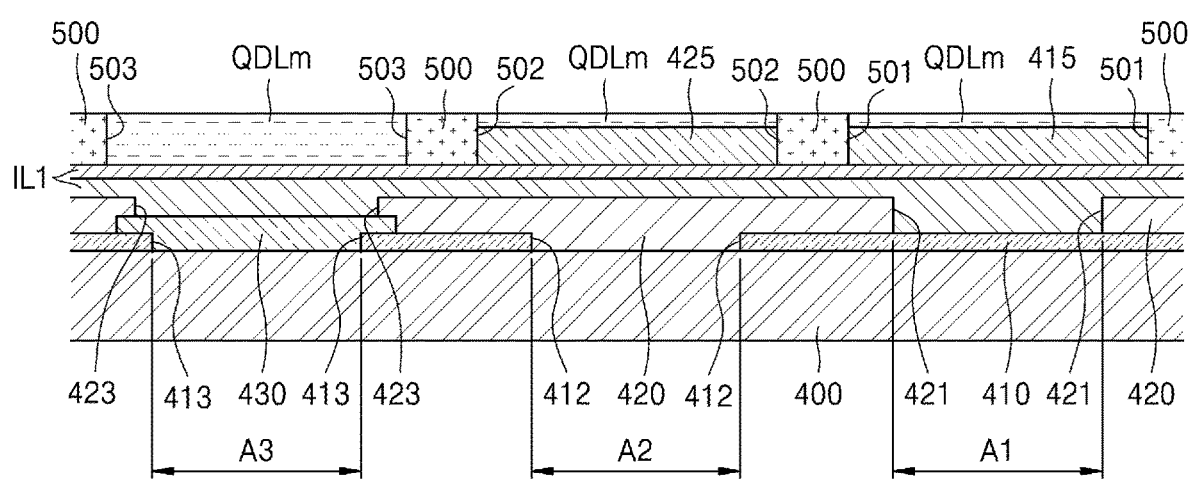

Referring to FIG. 7C, the quantum dot layer material QDLm may be applied on the entire surface of the upper substrate 400. The quantum dot layer material QDLm applied on the entire surface of the upper substrate 400 may fill the third opening 503. Also, the quantum dot layer material QDLm may cover the first transmissive layer 415 and the second transmissive layer 425 formed in the first opening 501 and the second opening 502. In this case, the thickness of the quantum dot layer material QDLm filling the third opening 503 in the cross-sectional view may be greater than the thickness of the quantum dot layer material QDLm covering the first transmissive layer 415 and the second transmissive layer 425 in the cross-sectional view. On the other hand, although FIG. 7C illustrates a case in which the quantum dot layer material QDLm does not cover the bank 500, the disclosure is not limited thereto. For example, the quantum dot layer material QDLm may cover at least a portion of the upper surface of the bank 500.

Figure 7D:
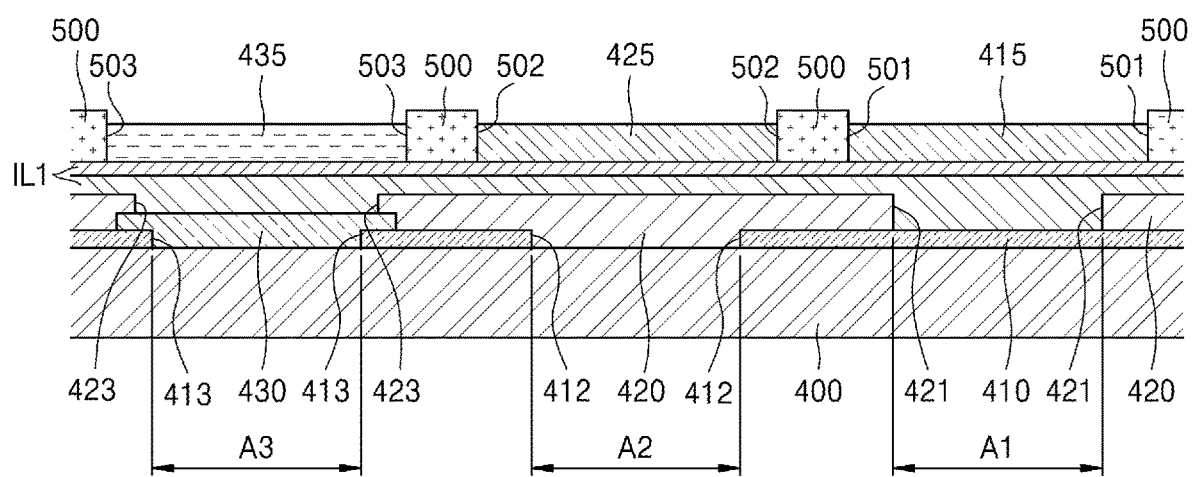

Referring to FIG. 7D, in the curing of the quantum dot layer material QDLm, a portion of the quantum dot layer material QDLm applied on the third opening 503 may be removed. Therefore, in the cross-sectional view, the thickness of the third color quantum dot layer 435 may be less than the thickness of the bank 500.

Also, in the curing of the quantum dot layer material QDLm, at least a portion of the quantum dot layer material QDLm covering the first transmissive layer 415 of the first opening 501 and the second transmissive layer 425 of the second opening 502 may be removed. In an embodiment, in the curing of the quantum dot layer material QDLm, the quantum dot layer material QDLm covering the first transmissive layer 415 of the first opening 501 and the second transmissive layer 425 of the second opening 502 may be completely removed. In this case, the quantum dot layer material QDLm may not remain in the first opening 501 and the second opening 502. Therefore, because it is possible to prevent or substantially prevent characteristics of light emitted from the first pixel (see PX1 of FIG. 4) and the second pixel (see PX2 of FIG. 4) from being affected by the remaining quantum dot layer material QDLm, high-quality full-color images may be implemented.

Referring to FIGS. 8A to 8D, in the method of manufacturing the display apparatus, according to an embodiment, after the third color quantum dot layer 435 is formed through an inkjet process, the first transmissive layer 415 and the second transmissive layer 425 may be formed through a coating process.

The inkjet process may include injecting the quantum dot layer material QDLm into the third opening 503 and curing the quantum dot layer material QDLm.

Figure 8A:
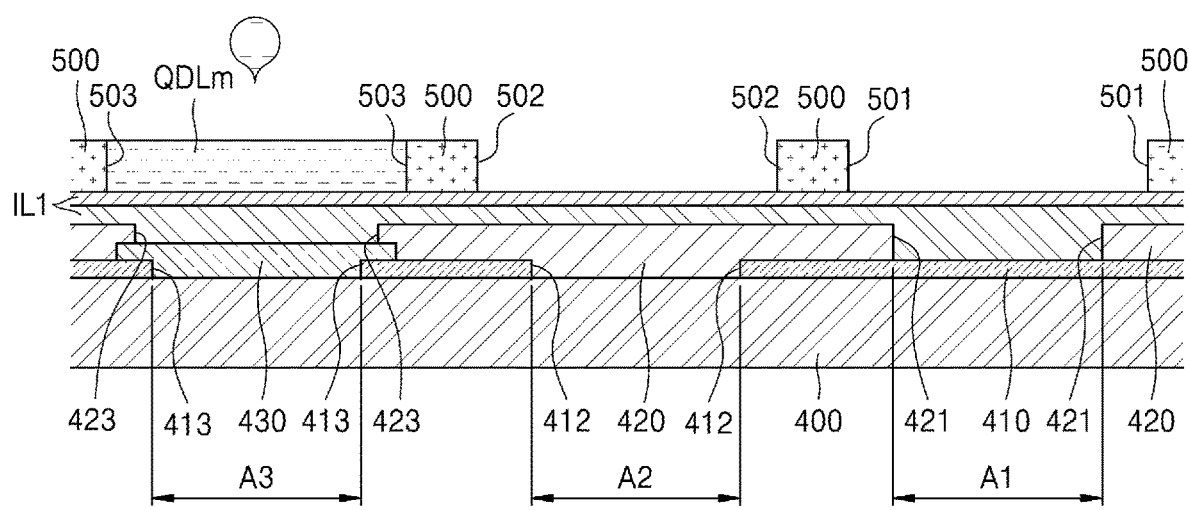
FIGS. 8A to 8D are cross-sectional views sequentially illustrating a part of a method of manufacturing a display apparatus, according to another embodiment.

Referring to FIG. 8A, the quantum dot layer material QDLm may be injected into the third opening 503 in an ink form through a nozzle arranged to correspond to the third opening 503.

Figure 8B:
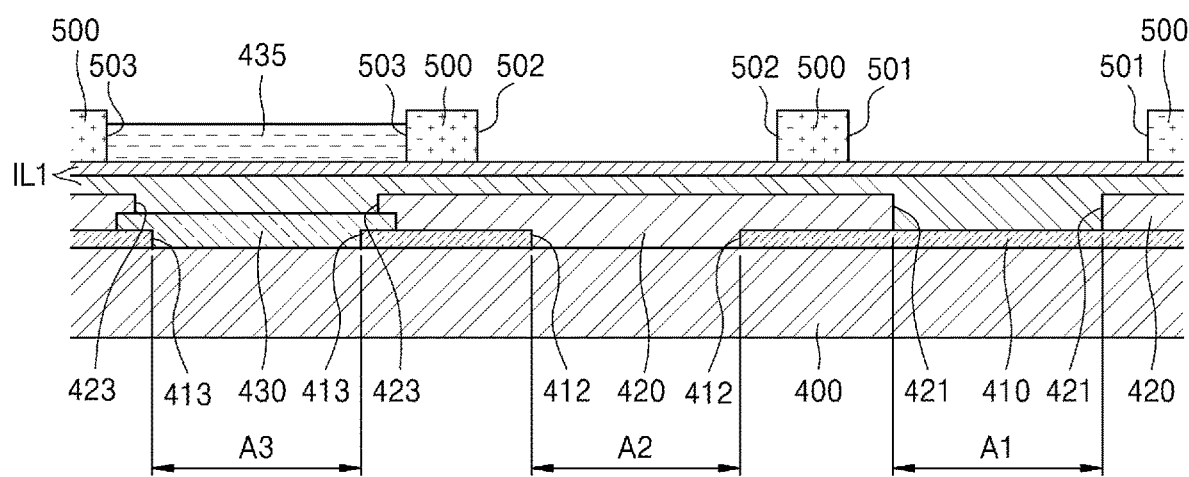

Referring to FIG. 8B, in the curing of the quantum dot layer material QDLm, a portion of the quantum dot layer material QDLm injected into the third opening 503 may be removed. Therefore, in the cross-sectional view, the thickness of the third color quantum dot layer 435 may be less than the thickness of the bank 500. Because the upper surface of the third color quantum dot layer 435 has a step difference from the upper surface of the bank 500, mixing of colors between pixels may be prevented or substantially prevented.

The coating process may include applying the transmissive layer material TLm on the entire surface of the upper substrate 400 and curing the transmissive layer material TLm. In an embodiment, the coating process may be performed after the inkjet process. In this case, the first transmissive layer 415 and the second transmissive layer 425 may be formed after the third color quantum dot layer 435 is formed.

Figure 8C:
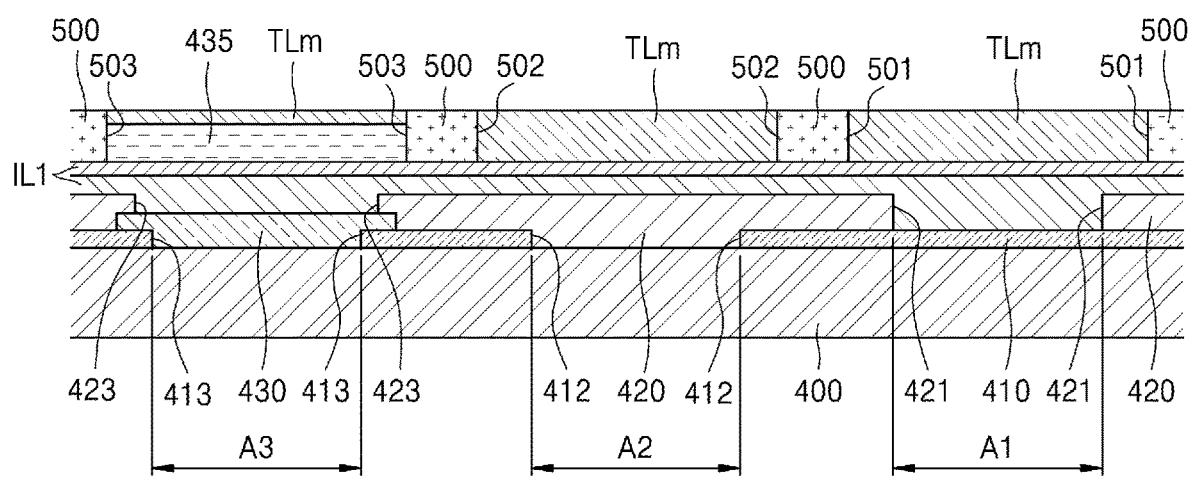

Referring to FIG. 8C, the transmissive layer material TLm may be applied on the entire surface of the upper substrate 400. The transmissive layer material TLm applied on the entire surface of the upper substrate 400 may fill the first opening 501 and the second opening 502. Also, the transmissive layer material TLm may cover the third color quantum dot layer 435 formed in the third opening 503. In this case, the thickness of the transmissive layer material TLm filling the first opening 501 and the second opening 502 in the cross-sectional view may be greater than the thickness of the transmissive layer material TLm covering the third color quantum dot layer 435 in the cross-sectional view. Although FIG. 8C illustrates a case in which the transmissive layer material TLm does not cover the bank 500, the disclosure is not limited thereto. For example, the transmissive layer material TLm may cover at least a portion of the upper surface of the bank 500.

Figure 8D:
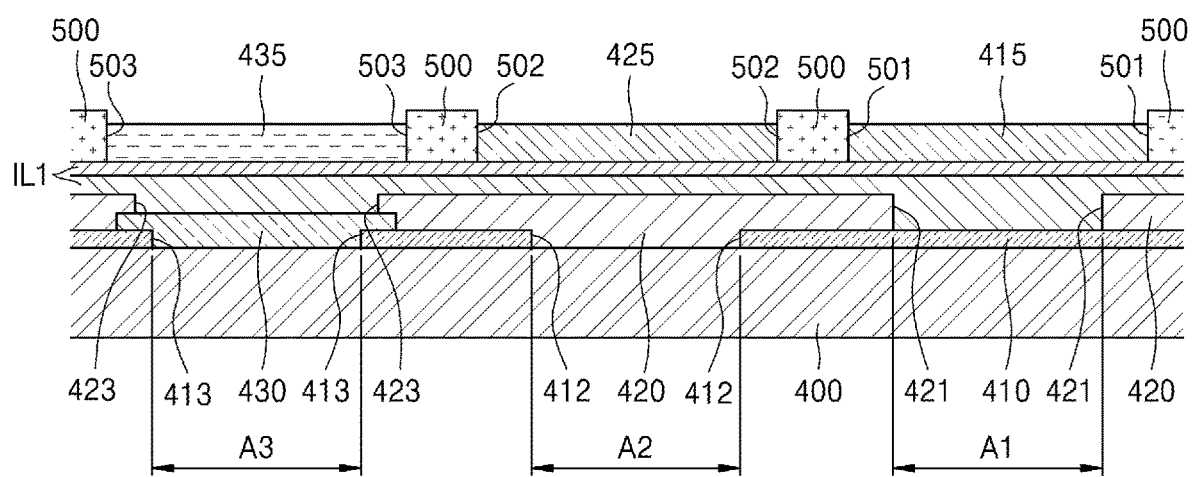

Referring to FIG. 8D, in the curing of the transmissive layer material TLm, a portion of the transmissive layer material TLm applied on the first opening 501 and the second opening 502 may be removed. Therefore, in the cross-sectional view, the thicknesses of the first transmissive layer 415 and the second transmissive layer 425 may be less than the thickness of the bank 500.

Also, in the curing of the transmissive layer material TLm, at least a portion of the transmissive layer material TLm covering the third color quantum dot layer 435 of the third opening 503 may be removed. In an embodiment, in the curing of the transmissive layer material TLm, the transmissive layer material TLm covering the third color quantum dot layer 435 of the third opening 503 may be completely removed. In this case, the transmissive layer material TLm may not remain in the third opening 503. Therefore, it is possible to prevent or substantially prevent characteristics of light emitted from the third pixel (see PX3 of FIG. 4) from being affected by the remaining transmissive layer material TLm, thereby implementing high-quality full-color images.

Only the method of manufacturing the display apparatus has been mainly described, but the disclosure is not limited thereto. For example, it will be understood that the display apparatus manufactured by any suitable method of manufacturing the display apparatus also falls within the scope of the disclosure.

According to one or more embodiments, a method of manufacturing a display apparatus, which is capable of minimizing or reducing defects in a manufacturing process and improving process efficiency, may be implemented. However, the scope of the disclosure is not limited by such an effect.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. Further, in this specification, the phrase "on a plane," or "plan view," means viewing a target portion from the top, and the phrase "on a cross-section" means viewing a cross-section formed by vertically cutting a target portion from the side.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A method of manufacturing a display apparatus, the method comprising:
    forming a first color filter layer in a first area of a substrate, a second color filter layer in a second area of the substrate, and a third color filter layer in a third area of the substrate;
    forming a bank having a first opening overlapping the first area, a second opening overlapping the second area, and a third opening overlapping the third area; and
    forming a first transmissive layer filling at least a portion of the first opening, a second transmissive layer filling at least a portion of the second opening and comprising a same material as the first transmissive layer, and a third color quantum dot layer filling at least a portion of the third opening,
    wherein the first color filter layer is between the first transmissive layer and the substrate.

2. The method of claim 1, wherein the first transmissive layer, the second transmissive layer, and the third color quantum dot layer are formed through an inkjet process.

3. The method of claim 2, wherein the inkjet process comprises:
    injecting a transmissive layer material into the first opening and the second opening and injecting a quantum dot layer material into the third opening; and
    curing the transmissive layer material and the quantum dot layer material.

4. The method of claim 3, wherein the curing of the transmissive layer material and the quantum dot layer material comprises removing a portion of the transmissive layer material in a thickness direction and removing a portion of the quantum dot layer material in the thickness direction.

5. The method of claim 3, wherein the first transmissive layer, the second transmissive layer, and the third color quantum dot layer are concurrently formed.

6. The method of claim 1, wherein
    the first transmissive layer and the second transmissive layer are formed through an inkjet process, and
    the third color quantum dot layer is formed through a coating process.

7. The method of claim 6, wherein
    the inkjet process comprises:
        injecting a transmissive layer material into the first opening and the second opening; and
        curing the transmissive layer material, and
    the coating process comprises:
        applying a quantum dot layer material on an entire surface of the substrate; and
        curing the quantum dot layer material.

8. The method of claim 7, wherein the curing of the transmissive layer material comprises removing a portion of the transmissive layer material.

9. The method of claim 7, wherein
the first transmissive layer and the second transmissive layer are concurrently formed, and
the third color quantum dot layer is formed after the first transmissive layer and the second transmissive layer are formed.

10. The method of claim 9, wherein the curing of the quantum dot layer material comprises removing the quantum dot layer material covering the first transmissive layer and the second transmissive layer.

11. The method of claim 1, wherein
the first transmissive layer and the second transmissive layer are formed through a coating process, and
the third color quantum dot layer is formed through an inkjet process.

12. The method of claim 11, wherein
the inkjet process comprises:
injecting a quantum dot layer material into the third opening; and
curing the quantum dot layer material, and
the coating process comprises:
applying a transmissive layer material on an entire surface of the substrate; and
curing the transmissive layer material.

13. The method of claim 12, wherein the curing of the quantum dot layer material comprises removing a portion of the quantum dot layer material.

14. The method of claim 12, wherein the first transmissive layer and the second transmissive layer are concurrently formed after the third color quantum dot layer is formed.

15. The method of claim 14, wherein the curing of the transmissive layer material comprises removing the transmissive layer material covering the third color quantum dot layer.

16. The method of claim 1, wherein:
the display apparatus comprises at least one first color emission layer and at least one second color emission layer, and
the first color emission layer is configured to emit light having a wavelength in a first wavelength band, and the second color emission layer is configured to emit light having a wavelength in a second wavelength band.

17. The method of claim 16, wherein the wavelength of the light emitted from the second color emission layer is longer than the wavelength of the light emitted from the first color emission layer.

18. The method of claim 17, wherein the third color quantum dot layer is configured to convert the light having the wavelength in the first wavelength band and the light having the wavelength in the second wavelength band into light having a wavelength in a third wavelength band.

19. The method of claim 18, wherein the first transmissive layer and the second transmissive layer do not change a wavelength of light passing therethrough.

20. The method of claim 19, wherein the first color filter layer is configured to transmit the light having the wavelength in the first wavelength band, the second color filter layer is configured to transmit the light having the wavelength in the second wavelength band, and the third color filter layer is configured to transmit the light having the wavelength in the third wavelength band.

* * * * *